United States Patent [19]

Myers et al.

[11] Patent Number: 4,722,022

[45] Date of Patent: Jan. 26, 1988

[54] SHIELDED LINE TERMINATOR ENCLOSURE

[75] Inventors: Earl C. Myers; Mark H. Waters, both of Harrisburg, Pa.

[73] Assignee: AMP Incorporated, Harrisburg, Pa.

[21] Appl. No.: 913,184

[22] Filed: Sep. 29, 1986

[51] Int. Cl.[4] ................................................ H05K 9/00

[52] U.S. Cl. .................................. 361/424; 174/35 C; 333/22 R; 439/620

[58] Field of Search .................... 361/424; 339/116 R, 339/116 C, 154 A, 156 R, 59 RM, 138, 141, 143 R; 333/22 R; 174/35 C; 439/620

[56] References Cited

U.S. PATENT DOCUMENTS

| | | | |
|---|---|---|---|
| 4,453,798 | 6/1984 | Asick et al. | 339/143 R |
| 4,557,919 | 3/1986 | Waters | 339/59 M |
| 4,585,292 | 4/1986 | Frantz et al. | 439/611 |

OTHER PUBLICATIONS

Data Sheets: I/O Terminators, Terminator Bus Interface Schematics External Shielded Style.

*Primary Examiner*—Philip H. Leung
*Assistant Examiner*—Morris Ginsburg
*Attorney, Agent, or Firm*—David L. Smith

[57] ABSTRACT

A removable dielectric enclosure or boot assembly for enclosing a shielded line terminator. The enclosure has a cavity having an opening for receiving a shielded line terminator such that the shell of the shielded line terminator is flush with the opening when the shielded line terminator is disposed in the cavity. The enclosure has screws captured in screw receiving apertures spaced to align with apertures in the shell such that when the shielded line terminator is mated with a complementary connector, the threaded end thereof is received in nut means associated with the complementary connector and a shoulder on the screw bears against the rear surface of the shell as the screw is rotated to draw the shielded line terminator and dielectric enclosure toward the complementary connector.

14 Claims, 3 Drawing Figures

SHIELDED LINE TERMINATOR ENCLOSURE

BACKGROUND OF THE INVENTION

This invention relates to dielectric enclosures and in particular to a removable dielectric enclosure for a shielded line terminator.

Shielded line terminators have previously been made by a postmolding operation in which a shielded line terminator was manufactured and subsequently a dielectric boot was overmolded on the shielded line terminator housing.

While the overmolding process resulted in a dielectric boot surrounding a shielded line terminator, access to the shielded line terminator such as for service or reconfiguration was impractical necessitating discarding a defective overmolded shielded line terminator and replacing it with another.

The present invention provides a removable dielectric enclosure for a shielded line terminator that provides access to the shielded line terminator.

SUMMARY OF THE INVENTION

In accordance with the present invention, a dielectric enclosure or boot assembly for enclosing a shielded line terminator has a cavity with an opening for receiving the shielded line terminator. The enclosure has inner endwalls that terminate within the cavity recessed from the opening such that when the shielded line terminator is disposed within the cavity the inner endwalls engage the rear surface of the shell to position the shell flush with the opening. Screws having a threaded end, an opposed head and an enlarged shank therebetween are captured in screw-receiving apertures in shoulders of external endwalls with the screw receiving apertures spaced to align with apertures in the shell such that the screws are received between an internal endwall and the adjacent external endwall. A shoulder on the enlarged shank of the screws facing the threaded end engages the rear surface of the shell surrounding the apertures such that when the shielded line terminator is mated with a complementary connector, the threaded end is received in nut means associated with the complementary connector and the shielded line terminator and enclosure are drawn toward the complementary connector as the screw is rotated.

DESCRIPTION OF THE PREFERRED EMBODIMENT

Figure 1:
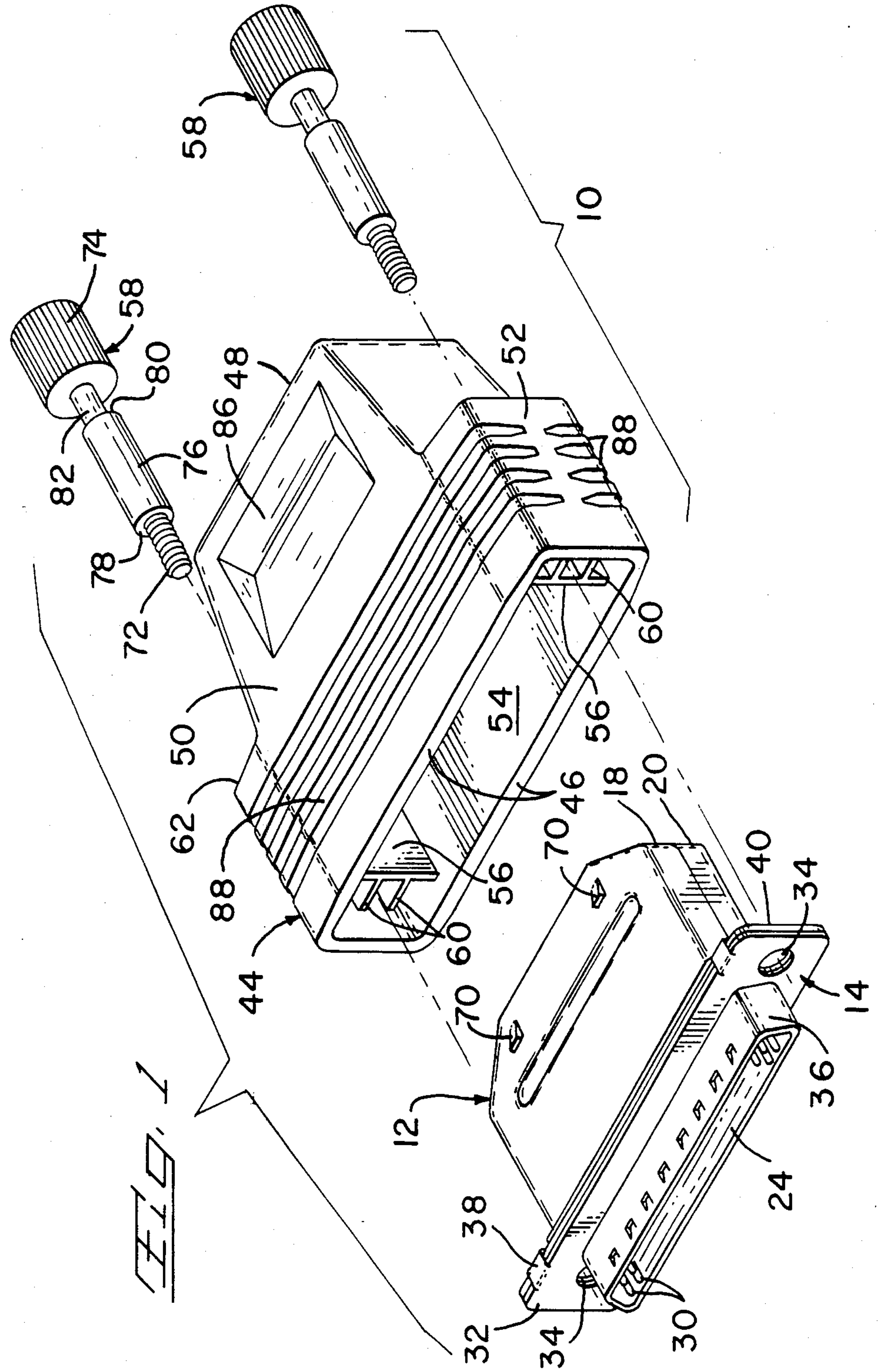
FIG. 1 is an exploded perspective view of a shielded line terminator and enclosure therefor in accordance with the present invention.

Referring to the Drawings, initially to FIG. 1, there is depicted therein an exploded perspective view of a dielectric shielded line terminator enclosure 10 in accordance with the present invention with a shielded line terminator 12. Shielded line terminator 12 is comprised of electrical connector 14, circuit board 16 and a pair of electrically conductive shields 18, 20 which are typically metal.

Connector 14 has insulative housing 22 molded of thermoplastic, a mating face 24, an opposed rear face 26 and a plurality of contact receiving passages 28 extending therebetween having contacts 30 secured therein. Front shell 32 has mounting apertures 34 at opposite ends thereof for securing a complementary connector thereto. Shroud 36 integral with front shell 32 encloses the forward portion of housing 22. Gripping lugs 38 fold into recesses in rear shell 40 to secure the shells together. Rear shell 40 has an outer profile similar to front shell 32 with mounting apertures aligned with apertures 34. Rear shell 40 is profiled to receive a portion of housing 22 and has a central opening with a plurality of recesses 42 along the marginal edges thereof. Tines 41 on shields 18 and 20 extend into recesses 42 as the shields are rotated about the tines into engagement encompassing the line terminator and rear face of the connector. The line terminator once enclosed within shields 18 and 20 is a shielded line terminator.

Enclosure or boot 44 is molded from a suitable dielectric material and receives shielded line terminator 12 in an interference fit. Boot 44 has an open connector and shield receiving end 46, an opposed closed rear wall 48, opposed outer sidewalls 50 and opposed outer end walls 52 extending therebetween. Walls 48, 50 and 52 define therewithin a cavity 54 for receiving shielded line terminator 12. A pair of inner end walls 56 are spaced sufficiently far from the adjacent outer end wall 52 to receive jack screw 58 in the intervening space. Ribs 60 extend between an outer endwall 52 and the adjacent inner endwall 56 to position jack screw 58 centrally between outer side walls 50.

Figure 2:
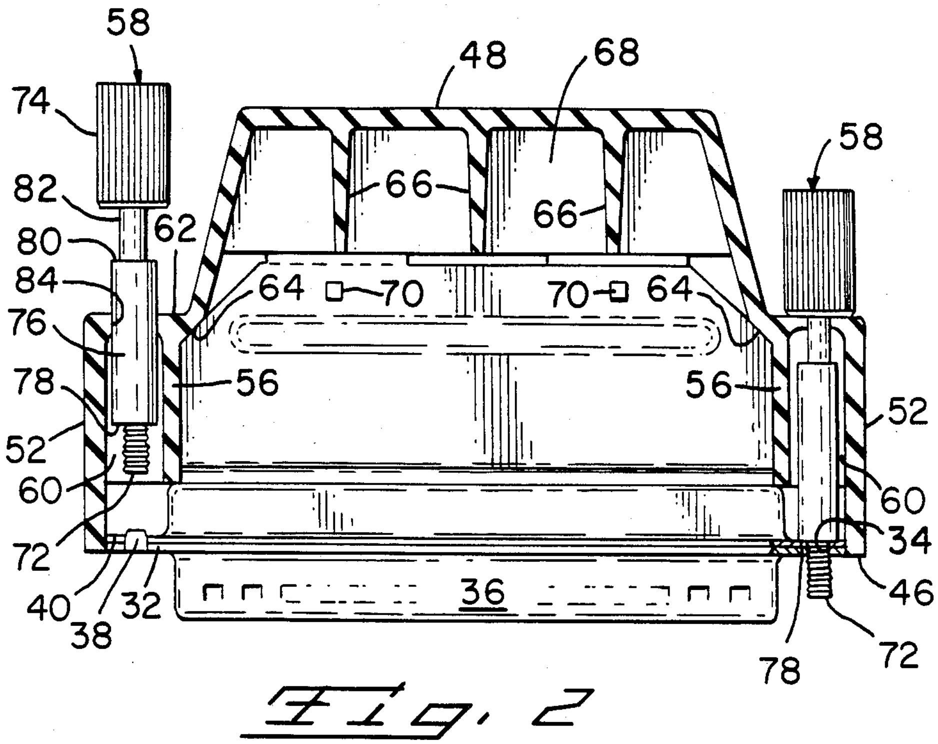
FIG. 2 is a side view, partially in section, of the shielded line terminator having the enclosure assembled thereto.

As best seen in FIG. 2, with shielded line terminator 12 disposed in cavity 54 such that front shell 32 is flush with connector receiving end 46, several features contribute to maintaining the relative position of the terminator 12 and enclosure 10. Inner endwalls 56 and ribs 60 extend from shoulder 62 toward connector receiving end 46 terminating within cavity 54 recessed from end 46 abutting the portion of rear shell 40 receiving housing 22. Inside shoulders 64 engage angled corners of shields 18 and 20.

Figure 3:
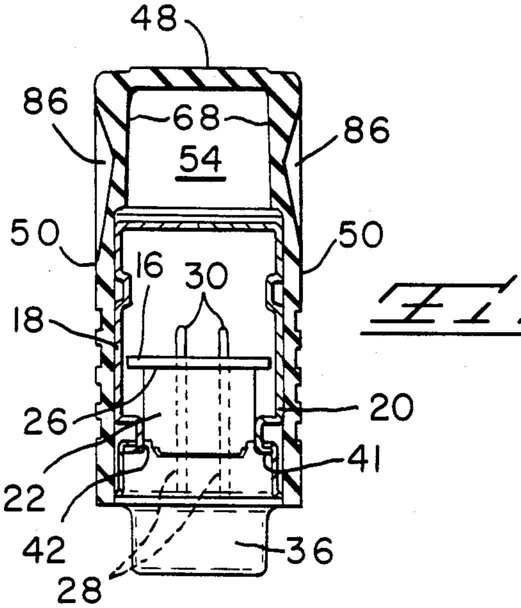
FIG. 3 is an end view, partially in section of the shielded line terminator having the enclosure assembled thereto.

Ribs 66 extend from closed rear wall 48 toward connector receiving end 46 terminating within cavity 54 abutting shields 18 and 20. Inner sidewalls 68, see FIG. 3, are molded against outer sidewalls 50 and are recessed from connector receiving end 46, typically terminating along the ends of ribs 66 abutting shields 18 and 20.

Gripping means 70 on shields 18 and 20 engage the inner surface of outer sidewalls 50 enhancing the friction fit between shielded line terminator 12 and enclosure 10. Inner sidewalls 56, ribs 60, 66, and inner sidewalls 68 provide strength to enclosure 10 in addition to maintaining the position of shielded line terminator 12 within the enclosure. Furthermore, ribs 60 serve to assist speedy location of jack screws 58 and guide jack screws 58 into nut means (not shown) in the flange of a complementary connector.

Rear wall 48 may be spaced from the rear surface of shields 18, 20 with ribs 66 extending between rear wall 48, shields 18, 20 and sidewalls 50, thereby providing a greater surface area to sidewall 50 for gripping a shielded line terminator. The exterior surface of rear wall 48 provides an area for adhesive identification labels. Sidewalls 50 are molded with gripping indents 86 which are used for removing enclosure or boot 10 having a shielded line terminator 12 disposed therein from a mating connector. With screws 58 unthreaded from nut means in a mating connector, gripping enclosure or boot 10 by indents 86 provides a normal force between the inner surface of sidewalls 50 and shields 18, 20 which translates into a frictional force when the line terminator is unmated. A greater normal force can be obtained by grasping enclosure or boot 10 on sidewalls 50 closer to shield receiving end 46 in the region of ribs 88. Gripping enclosure or boot 10 in the region of ribs 88 when unmating the shielded line terminator assures that the shielded line terminator will unmate and remain within the enclosure rather than the enclosure disengaging from the shielded line terminator leaving the shielded line terminator mated.

Jack screws 58 each comprise a threaded end 72, an opposed head 74 and an enlarged shank 76 therebetween. Shank 76 has a first shoulder 78 adjacent end 72 and a second shoulder 80 facing head 74 defining a constricted neck 82 between shank 76 and head 74.

The left side of FIG. 2 shows a jack screw 58 being received in aperture 84 in shoulder 62. Jack screws 58 are removably secured in apertures 84 which are highly compliant. While molded to closely receive constricted neck 82 as shown on the right side of FIG. 2, apertures 84 readily expand to receive the enlarged shank 76 during insertion of jack screw 58 as shown on the left side of FIG. 2. Once inserted, jack screws 58 are thus retained in enclosure 10. While threaded end 72 is shown passing through aperture 34 and extending beyond front shell 32, screw 58 may be moved axially until second shoulder 80 abuts enclosure 10 surrounding aperture 84 without forcing shank 76 back through aperture 84 or withdrawing threaded end 72 from aperture 34.

When connector 14 is mated with a complementary connector, threaded end 72 of jack screw 58 is received in nut means associated with the complementary connector. First shoulder 78 bears against rear shell 40 as head 74 is rotated to draw connector 14 and the complementary connector together.

A removable dielectric enclosure or boot assembly for use with a shielded line terminator has been disclosed which includes an enclosure having a cavity and an opening therein for encompassing the shielded line terminator and jack screws for threadedly engaging a complementary connector. The shielded line terminator is disposed in the cavity such that the shell is flush with the opening. The enclosure has screws captured in screw receiving apertures spaced to align with apertures in the shell such that when the shielded line terminator is mated with a complementary connector the threaded end of the screw is received in nut means associated with the complementary connector and a shoulder on the screw bears against the rear surface of the shell as the screw is rotated to draw the shielded line terminator and enclosure toward the complementary connector.

We claim:

1. A shielded line terminator assembly including a removable dielectric boot assembly, comprising:

a shielded line terminator having an insulative housing having a front mating face, a rear face and contact receiving passages extending therebetween with contacts secured therein, metal shell means mounted on the periphery of said housing between said faces, said shell means having a mounting aperture, a line terminator engaging the contacts proximate the rear face of the housing, and a metal shield encompassing the line terminator, said shield being electrically connected with the metal shell means;

a dielectric housing defining a cavity and having an opening for receiving the shielded line terminator, said housing having an aperture therein;

screw means passing through the aperture in the housing and the aperture in the shell means to retain the shielded line terminator against a complementary connector, said screw means comprising at least one screw having a threaded end, an opposed head, an enlarged shank therebetween, said shank having a first shoulder facing said threaded end and a second shoulder facing said head, said second shoulder and said head defining a constricted neck therebetween, said screw means passing aperture receives said screw therethrough for alignment with the aperture in the shell means, said screw means passing aperture being sized to closely receive said constricted neck, said screw means passing aperture being expansible to receive said enlarged shank therethrough, whereby upon disposing the shielded line terminator assembly within the boot assembly and inserting the screw into the screw means passing aperture so that the threaded end extends through the aperture in the shell means, the constricted neck is captured in the screw means passing aperture in the boot assembly, the first shoulder bearing against the shell means to draw the shielded line terminator assembly to a complementary connector as the head is rotated.

2. A shielded line terminator assembly as recited in claim 1 wherein the housing has opposed outer sidewalls and opposed outer endwalls, the screw means comprising two screws, each of the screws being received adjacent an outer endwall.

3. A shielded line terminator assembly as recited in claim 2 wherein the dielectric housing further comprises a pair of inner endwalls spaced from and generally parallel to respective outer endwalls, said inner endwalls spaced to receive said shielded line terminator therebetween, each of the screws being received between an inner endwall and the adjacent external endwall.

4. A shielded line terminator assembly as recited in claim 3 wherein the inner end walls terminate within the cavity recessed from the opening such that when the shielded line terminator is disposed within the cavity the inner end walls engage a rear surface of the shell means, whereby the shell means is positioned flush with the opening in the housing.

5. A dielectric boot assembly for use with a shielded line terminator of the type having an insulative housing having a front mating face, a rear face and contact receiving passages extending therebetween with contacts secured therein, metal shell means mounted on the periphery of said housing between said faces, said shell means having a mounting aperture, a line terminator engaging the contacts proximate the rear face of the housing, and a metal shield encompassing the line terminator, said shield being electrically conductive with the metal shell means, said boot assembly comprising:

a dielectric housing having an aperture therein, said housing defining a cavity having an opening adapted to receive the shielded line terminator and a closed end extending rearward from the opening;

screw means passing through the aperture in the housing and the aperture in the shell means are adapted to retain the line terminator, when received in the cavity, against a complementary connector, said screw means comprising at least one screw having a threaded end, an opposed head, an enlarged shank therebetween, said shank having a first shoulder facing said threaded end and a second shoulder facing said head, said second shoulder and said head defining a constricted neck therebetween, said screw means passing aperture receives said screw therethrough from alignment with the aperture in the shell means, said screw means passing aperture being sized to closely receive said constricted neck, said screw means passing aperture being expansible to receive said enlarged shank therethrough, whereby upon disposing the shielded line terminator within the boot assembly and inserting the screw into the screw means passing aperture so that the threaded end extends through the aperture in the shell means, the constricted neck is captured in the screw means passing aperture in the boot assembly, the first shoulder bearing against the shell means to draw the shielded line terminator to a complementary connector as the head is rotated.

6. A dielectric boot assembly for use with a shielded line terminator as recited in claim 5 wherein the housing has opposed outer sidewalls and opposed outer endwalls, the screw means comprising two screws, each of the screws being received adjacent an outer endwall.

7. A dielectric boot assembly for use with a shielded line terminator as recited in claim 6 further comprising a pair of inner endwalls spaced from and generally parallel to respective outer endwalls, said inner endwalls spaced to receive and shielded line terminator therebetween, each of the screws being received between an inner endwall and the adjacent external endwall.

8. A dielectric boot assembly for use with a shielded line terminator as recited in claim 7 wherein the inner endwalls terminate within the cavity recessed from the opening such that when the shielded line terminator is disposed within the cavity the inner endwalls engage the rear surface of the shell means, whereby the shell means is positioned flush with the opening in the housing.

9. A shielded line terminator assembly including a removable dielectric boot assembly, comprising:

a shielded line terminator having an insulative housing having a front mating face, a rear face and contact receiving passages extending therebetween with contacts secured therein, metal shell means mounted on the periphery of said housing between said faces, said shell means having a mounting aperture, a line terminator engaging the contacts proximate the rear face of the housing, and a metal shield encompassing the line terminator, said shield being electrically connected with the metal shell means; and a dielectric housing defining a cavity and having an opening for receiving the shielded line terminator.

10. A shielded line terminator assembly as recited in claim 9 wherein the dielectric housing has opposed outer sidewalls, said sidewalls having gripping indents to facilitate removal of the shielded line terminator from a complementary connector.

11. A shielded line terminator assembly as recited in claim 9 wherein the dielectric housing has opposed outer sidewalls, a rear wall spaced from the metal shield and extending between the opposed outer sidewalls, and further comprises ribs extending between the opposed outer sidewalls and between the spaced rear wall and the metal shield, whereby the dielectric boot assembly extends beyond the metal shield and the ribs position the shielded line terminator within the cavity such that the shell means is flush with the cavity opening.

12. A shielded line terminator assembly as recited in claim 11 further comprising an aperture in the housing having screw means passing therethrough, said screw means also passing through the mounting aperture in the shell means to retain the shielded line terminator against a complementary connector, said screw means comprising at least one screw having a threaded end, an opposed head, an enlarged shank therebetween, said shank having a first shoulder facing said threaded end and a second shoulder facing said head, said second shoulder and said head defining a constricted neck therebetween, said screw means passing aperture receives said screw therethrough for alignment with the aperture in the shell means, said screw means passing aperture being sized to closely receive said constricted neck, said screw means passing aperture being expansible to receive said enlarged shank therethrough, whereby upon disposing the shielded line terminator within the boot assembly and inserting the screw into the screw means passing aperture so that the threaded end extends through the aperture in the shell means, the constricted neck is captured in the screw means passing aperture in the boot assembly, the first shoulder bearing aganist the shell means to draw the shielded line terminator to a complementary connector as the head is rotated.

13. A shielded line terminator assembly as recited in claim 12 wherein the housing has opposed outer endwalls, the screw means comprising two screws, each of the screws being received adjacent an outer endwall.

14. A shielded line terminator assembly as recited in claim 13 wherein said sidewalls have gripping indents to facilitate unmating of the shielded line terminator from a complementary connector.

* * * * *